United States Patent [19]

Andre et al.

[11] 4,159,475
[45] Jun. 26, 1979

[54] VCO-CONTROLLED PHASE LOCK SYSTEM

[75] Inventors: Stephen N. Andre, Cheektowaga; Hendrik W. Prinsen, Williamsville, both of N.Y.

[73] Assignee: Calspan Corporation, Buffalo, N.Y.

[21] Appl. No.: 913,997

[22] Filed: Jun. 5, 1978

[51] Int. Cl.² ............................ G01S 7/36; G01S 9/02
[52] U.S. Cl. ............................... 343/5 AF; 343/18 E; 343/100 PE
[58] Field of Search ............. 343/5 AF, 18 E, 100 PE

[56] References Cited
U.S. PATENT DOCUMENTS 3,049,703  8/1962  Davis .......................... 343/100 PE X
3,234,547  2/1966  Katzin ........................ 343/100 PE X
3,369,234  2/1968  Bush et al. .................... 343/100 PE
3,417,396  12/1968 Stifter et al. .................. 343/5 AF X
3,716,856  2/1973  Beguin ........................ 343/100 PE X
4,053,882  10/1977 Etten .......................... 343/100 PE X
4,090,137  5/1978  Soma et al. ................... 343/100 PE X Primary Examiner—Malcolm F. Hubler
Attorney, Agent, or Firm—Allen J. Jaffe; David J. Zobkiw

[57] ABSTRACT

A phase coherent canceller for jamming suppression is provided with a variable controlled oscillator which is locked in frequency and phase to a reference local oscillator in a closed loop configuration.

1 Claim, 2 Drawing Figures

VCO-CONTROLLED PHASE LOCK SYSTEM

Phase coherent cancellers for jamming suppression conventionally utilize a phase locked loop comprising a phase detector, a phase shifter and associated circuits in a closed loop configuration. The phase shifter, an electronic unit for speed of operation, is, however, bound by phase shift limits which prevent continuous correction of accumulations of phase shift beyond the phase shift capability of the device. As a result, an automatic or manual reset capability for the phase shifter is required in the system.

It is an object of this invention to provide a phase locked loop which does not require reset.

It is a further object of this invention to provide a VCO-controlled phase lock system for ECCM systems. These objects, and others as will become apparent hereinafter, are accomplished by the present invention.

Basically, the present invention circumvents the reset requirements for the phase shifter in a conventional system by utilizing a variable controlled oscillator (VCO) which is locked in frequency and phase to the reference local oscillator in a closed loop configuration.

BRIEF DESCRIPTION OF THE DRAWINGS

For a fuller understanding of the present invention, reference should now be had to the following detailed description thereof taken in conjunction with the accompanying drawings wherein.

DESCRIPTION OF THE PREFERRED EMBODIMENT

Figure 1:
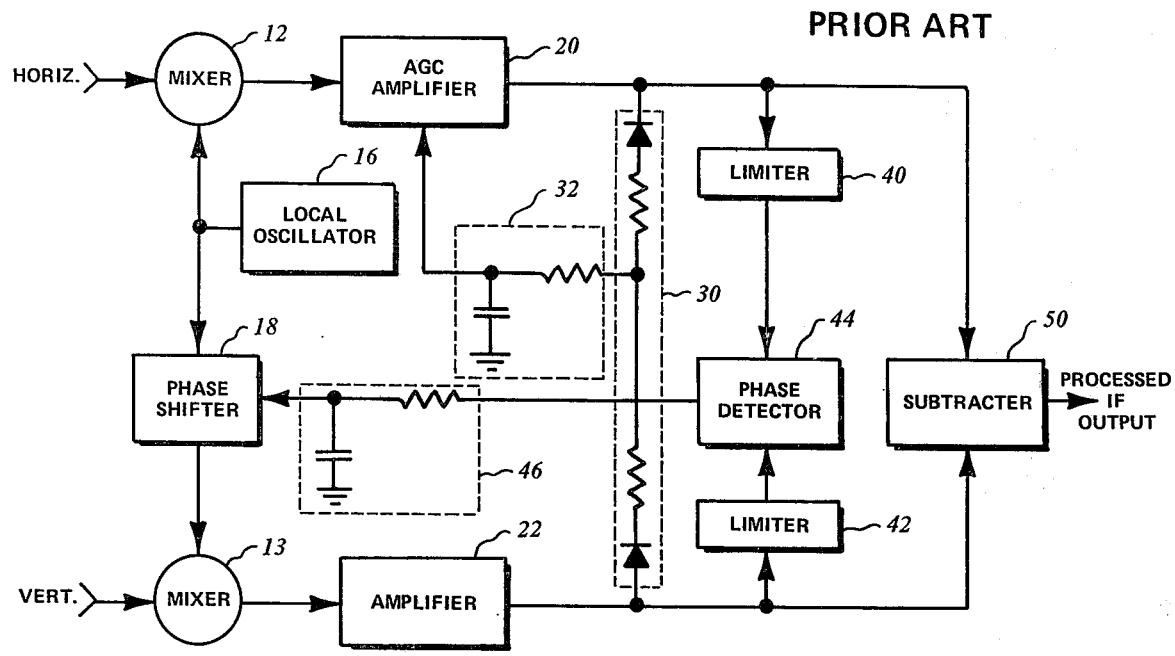
FIG. 1 is a schematic diagram of a prior art coherent receiver with a phase locked loop.

FIG. 1 illustrates a prior art phase coherent canceller for jamming suppression. In a dual-polarization radar system using this ECCM technique, the horizontal and vertical polarized components of the return signal are supplied as first inputs to mixers 12 and 13, respectively. Local oscillator 16 provides a second input to mixer 12 and a first input to phase shifter 18 which in turn supplies a second input to mixer 13. The output of mixer 12 is supplied to AGC amplifier 20 and the output of AGC amplifier 20 is supplied to the detector and summing network 30, to limiter 40 and as one input to subtracter 50. The output of mixer 13 is supplied to amplifier 22 and the output of amplifier 22 is supplied to the detector and summing network 30, to limiter 42 and as a second input to subtracter 50. The output of detector and summing network 30 is supplied via filter 32 as a feedback signal to AGC amplifier 20 to equalize the signals to maintain the outputs of AGC amplifier 20 and amplifier 22 at the same amplitude. Limiters 40 and 42 further remove amplitude variables in the outputs of AGC amplifier 20 and amplifier 22, respectively, and supply the resulting signals as inputs to phase detector 44. The output of phase detector 44 is a function of the phase of the two input signals and is supplied via filter 46 as a second input to phase shifter 18. Subtracter 50 subtracts the two input signals and the processed IF output is supplied to the remainder of the receiver (not shown). The system automatically adapts to receive the polarization state orthogonal to the jammer polarization. In this configuration, phase detector 44, phase shifter 18 and the associated circuits form a closed loop, phase locked loop configuration. Phase shifter 18 is an electronic unit for speed of operation but is bound by phase shift limits which prevent continuous correction of accumulations of phase shift beyond the phase shift capability of the device. As a result, an automatic or manual reset capability for the phase shifter 18 is required in the FIG. 1 configuration. For example, if the required phase shift exceeds 360° then detector circuitry in the drive circuits to the phase shifter could cause the phase shifter to reset to 0° phase shift instead of 360° phase shift.

Figure 2:
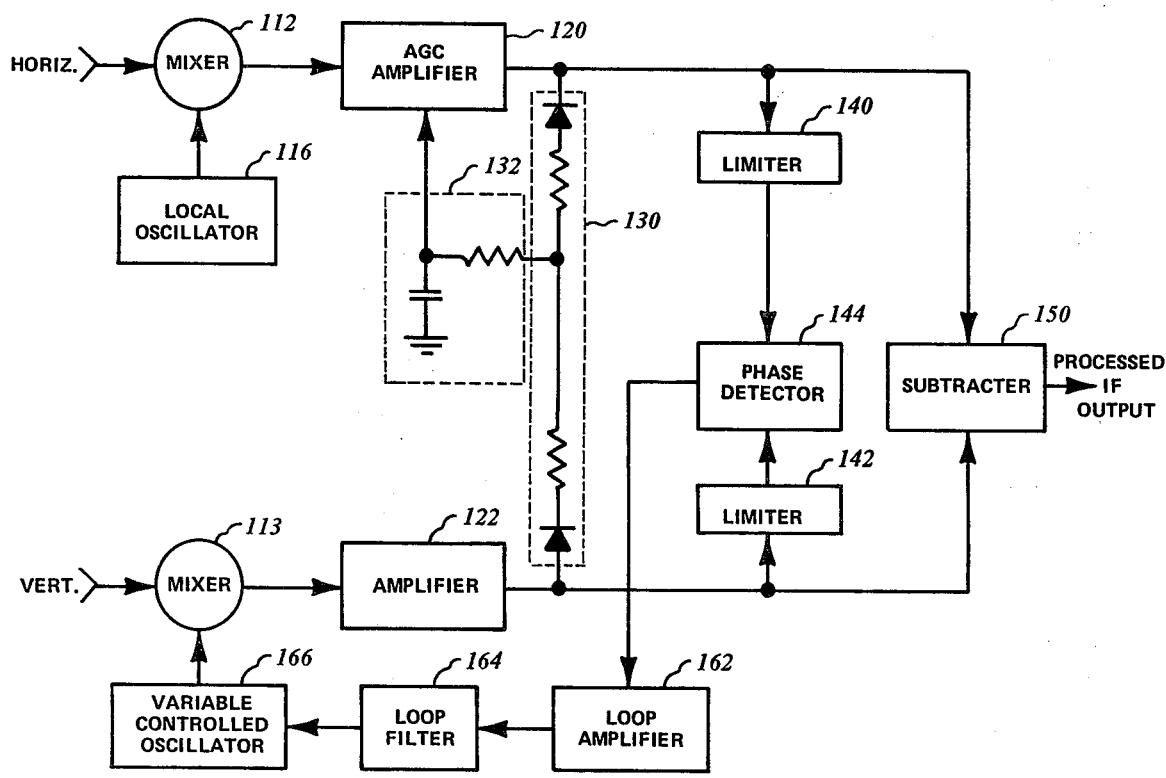
FIG. 2 is a schematic diagram of a receiver employing a VCO-controlled phase lock system.

The FIG. 2 configuration avoids the deficiencies of the prior art configuration of FIG. 1 by utilizing a variable controlled oscillator 166 which is locked in frequency and phase to the reference local oscillator 116 in a closed loop configuration. In a dual-polarized radar system, the horizontal and vertical components of the return signal are supplied as first inputs to mixers 112 and 113, respectively. Local oscillator 116 provides a second input to mixer 112 and variable controlled oscillator 166 provides a second input to mixer 113. The output of mixer 112 is amplified by AGC amplifier 120 and supplied to detector and summing network 130, limiter 140 and subtracter 150. Similarly the output of mixer 113 is amplified by amplifier 122 and is supplied to detector and summing network 130, limiter 142 and subtracter 150. The output of detector and summing network 130 is supplied via filter 132 as a feedback signal to AGC amplifier 120 to equalize the signals in order to maintain the outputs of AGC amplifier 120 and amplifier 122 at the same amplitude. Limiters 140 and 142 further remove the amplitude variables in the outputs of AGC amplifier 120 and amplifier 122, respectively, and supply the resulting signals as inputs to phase detector 144. The output of phase detector 144 is a function of the phase of the two input signals from limiters 140 and 142 and is supplied via loop amplifier 162 and loop filter 164 to variable controlled oscillator 166. The frequency of variable controlled oscillator 166 is thereby equal to the frequency of local oscillator 116 and is equal in phase. Subtracter 150 subtracts the input signal supplied by AGC amplifier 120 from the amplifier signal supplied by amplifier 122 and the processed IF output is supplied to the remainder of the receiver circuits (not shown). The output signal has removed from it interference or jamming signals common to both channels. The configuration of FIG. 2 can be made to operate such that the output of variable controlled oscillator 166 will be locked in frequency to the output of local oscillator 116 when signals of the same frequency are fed to the horizontal and vertical input mixers 112 and 113, respectively. Through the closed loop action of the system and control of the variable controlled oscillator 166, the phase of the two signals into phase detector 144 will remain locked within close limits which are determined by the loop design and loop gain. For example, phase lock to better than ±1° is readily achieved.

Although a preferred embodiment of the present invention has been illustrated and described, other changes will occur to those skilled in the art. It is therefore intended that the scope of the present invention is to be limited only by the scope of the appended claims.

We claim:

1. A phase lock system for use in a radar system including:
    first mixer means for receiving the horizontal components of a radar return signal as a first input;

second mixer means for receiving the vertical components of a radar return signal as a first input;

local oscillator means for supplying a second input to said first mixer means;

variable controlled oscillator means for supplying a second input to said second mixer means;

AGC amplifier means operatively connected to said first mixer means and providing a first amplified output signal;

amplifier means operatively connected to said second mixer means and providing a second amplified output signal;

detector and summing network means responsive to said first and second amplified output signals for supplying a feed back signal to said AGC amplifier means to maintain said first and second amplified output signals at the same amplitude;

phase detector means responsive to said first and second amplified output signals for supplying a feedback signal which is a function of the phase of said first and second amplified output signals to said variable controlled oscillator means whereby said second input supplied by said variable controlled oscillator means is locked in frequency to said second input signal supplied by said local oscillator means when the horizontal and vertical components of the radar return signal are supplied to said first and second mixers, respectively, at the same frequency; and subtracter means responsive to said first and second amplified output signals for supplying a processed IF output.

* * * * *